(12) United States Patent
Park et al.

(10) Patent No.: US 11,635,846 B2
(45) Date of Patent: Apr. 25, 2023

(54) DISPLAY DEVICE

(71) Applicant: SAMSUNG DISPLAY CO., LTD., Yongin-si (KR)

(72) Inventors: Sang Hun Park, Yongin-si (KR); Yong Sub So, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/411,317

(22) Filed: Aug. 25, 2021

(65) Prior Publication Data

US 2022/0206656 A1 Jun. 30, 2022

(30) Foreign Application Priority Data

Dec. 28, 2020 (KR) .......................... 10-2020-0184837

(51) Int. Cl.
*G06F 3/041* (2006.01)
*G06F 3/044* (2006.01)
*H01L 27/12* (2006.01)

(52) U.S. Cl.
CPC ........ *G06F 3/04166* (2019.05); *G06F 3/0443* (2019.05); *G06F 3/04164* (2019.05); *H01L 27/124* (2013.01)

(58) Field of Classification Search
CPC ............. G06F 3/04166; G06F 3/04164; G06F 3/0443; H01L 27/124
See application file for complete search history.

(56) References Cited

U.S. PATENT DOCUMENTS

| | | | |
|---|---|---|---|
| 8,970,543 B2 * | 3/2015 | Kwon | G06F 3/0446 345/174 |
| 9,024,913 B1 | 5/2015 | Jung et al. | |
| 9,223,425 B1 | 12/2015 | Kim et al. | |
| 9,383,844 B2 * | 7/2016 | Park | G06F 3/041 |
| 9,430,101 B2 * | 8/2016 | Ko | G06F 3/04164 |
| 9,891,762 B2 * | 2/2018 | Lee | G06F 3/0412 |
| 10,198,130 B2 * | 2/2019 | Liu | G06F 3/04164 |
| 10,268,304 B2 * | 4/2019 | Wang | G06F 3/04164 |
| 10,275,089 B2 * | 4/2019 | Kim | G06F 3/0443 |
| 10,409,414 B2 | 9/2019 | Kim et al. | |
| 10,444,901 B2 * | 10/2019 | Shin | G02F 1/1343 |

(Continued)

FOREIGN PATENT DOCUMENTS

KR 10-2016-0030595 3/2016
KR 10-1633174 6/2016
(Continued)

*Primary Examiner* — Benyam Ketema
(74) *Attorney, Agent, or Firm* — F. Chau & Associates, LLC

(57) ABSTRACT

A display device includes a display substrate having a non-display area at least partially surrounding a display area, and pixels in the display area, and a sensor substrate covering the pixels and a portion of the display substrate. The display device also includes first and second pads in the non-display area, a first sensor on the sensor substrate, a first sensor line connecting the first pad and the first sensor, and a second sensor line connecting the second pad and the first sensor. In addition, the display device includes a sensor transmitter to supply a sensing signal to the first pad during a first period, and a sensor receiver to receive a sampling signal from the second pad during a second period after the first period.

20 Claims, 15 Drawing Sheets

(56) References Cited

U.S. PATENT DOCUMENTS

| | | | |
|---|---|---|---|
| 10,564,501 B2* | 2/2020 | Fujikawa | G02F 1/1368 |
| 10,606,397 B2* | 3/2020 | Jun | G06F 3/0446 |
| 10,775,916 B2* | 9/2020 | Kim | G09G 3/20 |
| 10,802,636 B2* | 10/2020 | Kim | G06F 3/047 |
| 10,809,855 B2* | 10/2020 | Hsiao | G06F 3/0446 |
| 10,866,663 B2* | 12/2020 | Jun | G06F 3/04164 |
| 10,949,041 B2* | 3/2021 | Jiang | G01R 27/2605 |
| 11,106,305 B2* | 8/2021 | Lee | H01L 27/323 |
| 2011/0048812 A1* | 3/2011 | Yilmaz | G06F 3/04164 178/18.06 |
| 2012/0113874 A1* | 5/2012 | Sanguinetti | H04B 1/525 455/73 |
| 2013/0141372 A1* | 6/2013 | Kang | G06F 3/0446 345/173 |
| 2014/0132525 A1* | 5/2014 | Pyo | G06F 3/0412 345/173 |
| 2014/0132526 A1* | 5/2014 | Lee | G06F 3/0443 345/173 |
| 2015/0042600 A1* | 2/2015 | Lukanc | G06F 3/0412 345/174 |
| 2015/0042601 A1* | 2/2015 | Lee | G06F 3/04164 345/174 |
| 2016/0291721 A1* | 10/2016 | Shepelev | G06F 3/0443 |
| 2017/0147123 A1* | 5/2017 | Wang | G06F 3/04164 |
| 2018/0121020 A1* | 5/2018 | Lee | G06F 3/04166 |
| 2018/0329555 A1* | 11/2018 | Kim | G06F 3/044 |
| 2018/0364830 A1* | 12/2018 | Shepelev | G06F 3/04164 |
| 2019/0102015 A1* | 4/2019 | Kim | H01L 27/323 |
| 2019/0179449 A1* | 6/2019 | Cho | G06F 3/04164 |
| 2020/0159352 A1* | 5/2020 | Shimada | G06F 3/0416 |
| 2020/0409500 A1* | 12/2020 | Kim | G06F 3/0445 |
| 2021/0026479 A1* | 1/2021 | Lee | G06F 3/0443 |
| 2021/0157467 A1* | 5/2021 | Choi | G06F 3/0443 |
| 2022/0004281 A1* | 1/2022 | Hyun | G06F 3/044 |
| 2022/0206656 A1* | 6/2022 | Park | G06F 3/04164 |
| 2022/0214792 A1* | 7/2022 | Park | G06F 3/04164 |

FOREIGN PATENT DOCUMENTS

| | | |
|---|---|---|
| KR | 10-2017-0092865 | 8/2017 |
| KR | 10-2022-0008998 | 1/2022 |

* cited by examiner

DISPLAY DEVICE

CROSS-REFERENCE TO RELATED APPLICATION

This application claims priority to and benefit of Korean Patent Application No. 10-2020-0184837, filed in the Korean Intellectual Property Office on Dec. 28, 2020, the entire contents of which are incorporated by reference herein.

BACKGROUND OF THE INVENTION

1. Field of the Invention

One or more embodiments described herein relate to a display device.

2. Description of the Related Art

Many display devices have been developed with capacitive sensors that detect touch inputs from a finger, active pen, or other object. The capacitive sensors may detect these inputs based on mutual capacitance of two or more sensors or based on self-capacitance of one or more of the sensors. In the self-capacitance method, RC load between sensors may vary based on distance between a touch integrated chip (a touch IC) and the sensors.

SUMMARY OF THE INVENTION

One or more embodiments described herein provide a display device that may match RC loads between sensors in a sensing method performed based on self-capacitance.

In accordance with one or more embodiments, a display device includes a display substrate including a non-display area around a display area, pixels disposed in the display area, a sensor substrate covering the pixels and a portion of the display substrate, a first pad disposed in the non-display area, a second pad disposed in the non-display area, a first sensor disposed on the sensor substrate, a first sensor line connecting the first pad and the first sensor, a second sensor line connecting the second pad and the first sensor, a sensor transmitter configured to supply a sensing signal to the first pad during a first period, and a sensor receiver configured to receive a sampling signal from the second pad during a second period after the first period.

In accordance with one or more embodiments, a display device includes a display panel including pixels and a plurality of pads, a touch panel including a first touch sensor and a second touch sensor, a first set of lines connecting the first touch sensor to first and second pads of the plurality of pads, and a second set of lines connecting the second touch sensor to third and fourth pads of the plurality of pads. Each of the first touch sensor and the second touch sensor are configured to sense a touch input based on self-capacitance. Lengths of the first set of lines and the first touch sensor correspond to an RC load substantially equal to an RC load based on lengths of the second set of lines and the second touch sensor.

DETAILED DESCRIPTION OF THE EMBODIMENTS

Figure 1A:
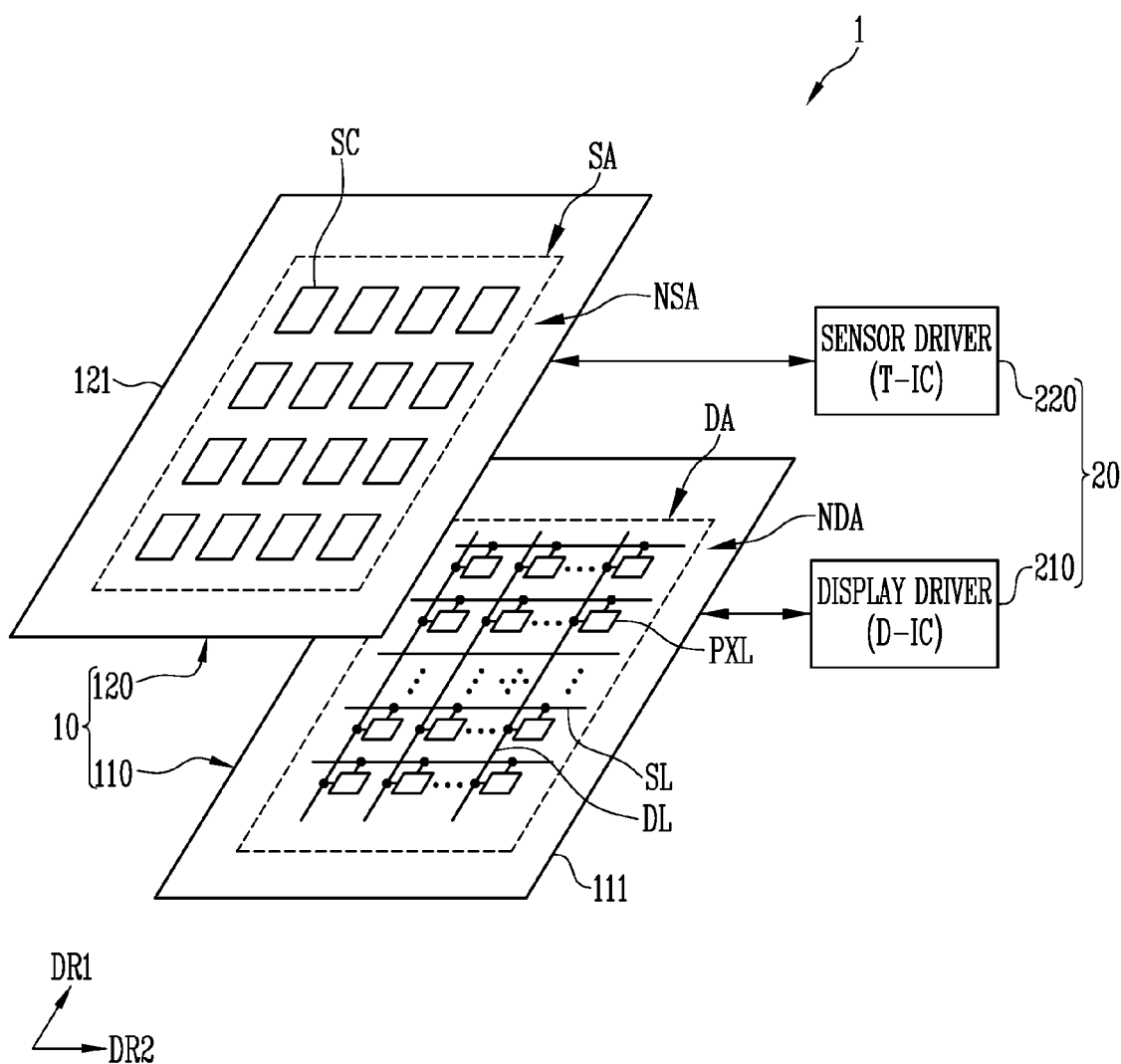
FIGS. 1A and 1B illustrate an embodiment of a display device.

The present invention will be described more fully hereinafter with reference to the accompanying drawings, in which embodiments of the invention are shown. As those skilled in the art would realize, the described embodiment may be modified in various different ways. To clearly describe the present invention, parts that are irrelevant to the description are omitted, and identical or similar constituent elements throughout the specification are denoted by the same reference numerals. Therefore, the above-mentioned reference numerals may be used in other drawings.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas, etc. may be exaggerated for clarity. In addition, the expression "equal to or the same as" in the description may mean "substantially equal to or the same as". That is, it may be the same enough to convince those skilled in the art to be the same. Even other expressions may be expressions from which "substantially" is omitted.

Figure 1B:
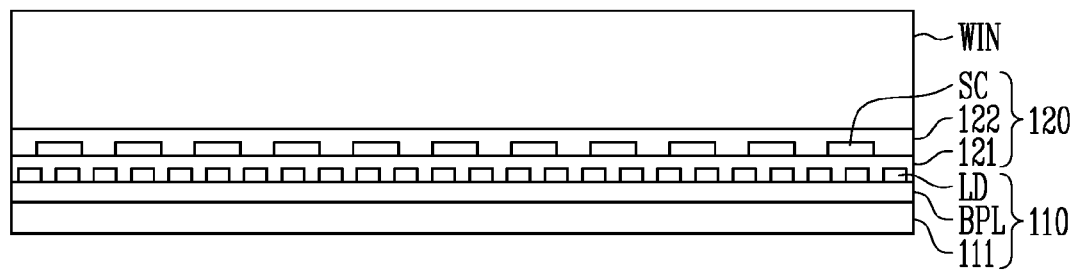

FIG. 1A and FIG. 1B illustrate an embodiment of a display device 1 which may include a panel 10 and a driving circuit part 20 for driving the panel 10. The panel 10 may include, for example, a display part (or display panel) 110 for displaying an image and a sensor part (or sensor panel) 120 for sensing touch, pressure, fingerprint, hovering, active pen, or other touch input. The sensor part 120 may be disposed to overlap the display part 110. For example, the panel 10 may include pixels PXL and sensors SC disposed to overlap at least some of the pixels PXL. The driving circuit part 20 may include a display driver 210 for driving the display part 110 and a sensor driver 220 for driving the sensor part 120.

In some embodiments, the display part 110 and the sensor part 120 may be separately manufactured from each other and then may be disposed and/or be combined so that at least one areas thereof overlap each other. In one embodiment, the display part 110 and the sensor part 120 may be integrally manufactured. For example, a sensor substrate 121 of the sensor part 120 may correspond to an upper substrate of the display part 110. For example, the sensor substrate 121 may be an encapsulation film covering the pixels PXL.

FIG. 1A illustrates the sensor part 120 disposed on a front surface (for example, an upper surface on which an image is displayed) of the display part 110, but the position of the sensor part 120 is not limited thereto. For example, in one embodiment, the sensor part 120 may be disposed on a rear surface or respective surfaces of the display part 110. In one embodiment, the sensor part 120 may be disposed on at least one edge area of the display part 110.

FIG. 1B illustrates an example of a stacked structure of display device 1. In this example, the sensor part (or sensor panel) 120 may be stacked at an upper portion of the display part (or display panel) 110, and a window WIN may be stacked at an upper portion of the sensor part 120.

The display part 110 may include a display substrate 111, a circuit element layer BPL formed on the display substrate 111, and light emitting diodes LD formed on the circuit element layer BPL. The circuit element layer BPL may include pixel circuits, scan lines SL, data lines DL, and the like for driving the light emitting diodes LD of the pixels PXL.

The sensor part 120 may include the sensor substrate 121, sensors SC formed on the sensor substrate 121, and a passivation film 122 covering the sensors SC.

In the embodiment of FIG. 1B, the sensor substrate 121 is shown in a form of an encapsulation film covering the pixels PXL.

The window WIN may be a protective member disposed at an uppermost portion of a module of the display device 1, and may be a substantially transparent transmissive substrate. The window WIN may have a multi-layered structure selected from a glass substrate, a plastic film, and a plastic substrate. The window WIN may include a rigid or flexible substrate, and the material of the window WIN may vary among embodiments. The display device 1 may further include a polarizing plate (or an anti-reflection layer) for preventing reflection of external light between the window WIN and the sensor part 120.

The display part 110 may include a display substrate 111 and a plurality of pixels PXL formed on the display substrate 111. The pixels PXL may be disposed in a display area DA of the display substrate 111. The display substrate 111 may include the display area DA in which an image is displayed and a non-display area NDA outside the display area DA. In some embodiments, the display area DA may be disposed in a central area of the display part 110, and the non-display area NDA may be disposed in an edge area of the display part 110 so as to at least partially surround the display area DA.

The display substrate 111 may be a rigid substrate or a flexible substrate, and its material or physical properties are not particularly limited. For example, the display substrate 111 may be a rigid substrate made of glass or tempered glass, or a flexible substrate formed of a thin film made of plastic or a metallic material.

The display area DA includes scan lines SL, data lines DL, and the pixels PXL connected to the scan lines SL and the data lines DL. The pixels PXL may be selected by a scan signal of a turn-on level supplied from the scan lines SL, and may receive a data voltage from the data lines DL and emit light with luminance corresponding to the data voltage. Accordingly, an image corresponding to the data voltage is displayed in the display area DA. The structure and driving method of pixels PXL are not particularly limited. For example, the pixels PXL may be implemented to have various structures and/or may be driven by various methods.

The non-display area NDA may include various wires connected to the pixels PXL of the display area DA and/or internal circuit parts. For example, the non-display area NDA may include a plurality of wires for supplying one or more levels of power from corresponding power sources and for supplying control signals to the display area DA. The non-display area NDA may also include a scan driver and/or other circuit for controlling operation of the display device or any of its attendant features.

In one embodiment, the type of the display part 110 is not particularly limited. For example, the display part 110 may be implemented as a self light-emitting-type display panel such as an organic light emitting display panel. In one embodiment, the display part 110 may be implemented as a non-light emitting type display panel such as a liquid crystal display panel. When the display part 110 is implemented in a non-light emitting type, the display device 1 may additionally include a light source such as a backlight unit.

The sensor part 120 includes the sensor substrate 121 and the plurality of sensors SC formed on the sensor substrate 121. The sensors SC may be disposed in a sensing area SA of the sensor substrate 121. The sensor substrate 121 may include the sensing area SA capable of sensing a touch input or the like and a peripheral area NSA outside the sensing area SA. In some embodiments, the sensing area SA may be disposed to overlap at least one area of the display area DA. For example, the sensing area SA may be set as an area corresponding to the display area DA (for example, an area overlapping the display area DA). In this case, the peripheral area NSA may be set as an area corresponding to the non-display area NDA (for example, an area overlapping the non-display area NDA). Accordingly, when a touch input or the like is provided on the display area DA, it is possible to detect the touch input through the sensor part 120.

The sensor substrate 121 may be a rigid or flexible substrate and may be configured as at least one insulation layer. In addition, the sensor substrate 121 may be a transparent or translucent transmissive substrate, but is not limited thereto. For example, the material and physical properties of the sensor substrate 121 are not particularly limited. For example, the sensor substrate 121 may be a rigid substrate made of glass or tempered glass, or a flexible substrate formed of a thin film made of plastic or a metallic material. In addition, in some embodiments, at least one substrate forming the display part 110 (for example, the display substrate 111, an encapsulation substrate and/or a thin film encapsulation layer) or at least one layer of insulation film or functional film disposed on an inner and/or outer surface of the display part 110 may be used as sensor substrate 121.

The sensing area SA may be an area capable of reacting to a user input (that is, an active area of a sensor). To this end, the sensors SC for sensing the user input or the like may be disposed in the sensing area SA. For example, the sensors SC may be disposed in a matrix form with reference to a first direction DR1 and a second direction DR2 orthogonal to the first direction DR1. In one embodiment, the first direction DR1 and the second direction DR2 may not be orthogonal. In one embodiment, the sensors SC may be circularly, elliptically, or obliquely disposed, but is not necessarily disposed in the matrix form. Each of the sensors SC may have various shapes, e.g., quadrangle, triangle, circle, mesh, or another shape.

In some embodiments, each of the sensors SC may have conductivity based on including at least one of a metallic material, a transparent conductive material, or various other conductive materials. For example, the sensors SC may include at least one of various metallic materials. Examples include gold (Au), silver (Ag), aluminum (Al), molybdenum (Mo), chromium (Cr), titanium (Ti), nickel (Ni), neodymium (Nd), copper (Cu), and platinum (Pt), or an alloy thereof. In this case, the sensors SC may be configured in a mesh form. In addition, the sensors SC may include at least one of various transparent conductive materials. Examples include silver nanowire (AgNW), indium tin oxide (ITO), indium zinc oxide (IZO), indium gallium zinc oxide (IGZO), antimony zinc oxide (AZO), indium tin zinc oxide (ITZO), zinc oxide (ZnO), tin oxide ($SnO_2$), a carbon nano tube, and a graphene. In addition, the sensors SC may have conductivity based on including at least one of various conductive materials. In addition, each of the sensors SC may be made of a single layer or multilayer, and the cross-sectional structure thereof is not particularly limited.

The driving circuit part 20 may include the display driver 210 for driving the display part 110 and the sensor driver 220 for driving the sensor part 120. In one embodiment, the display driver 210 and the sensor driver 220 may be configured of separate integrated chips from each other. In another embodiment, at least a portion of the display driver 210 and the sensor driver 220 may be integrated together in one IC.

The display driver 210 is electrically connected to the display part 110 to drive the pixels PXL. For example, the display driver 210 may include a data driver 12 and a timing controller 11, and a scan driver 13 may be separately mounted in the non-display area NDA of the display part 110 (e.g., see FIG. 2). In one embodiment, the display driver 210 may include all or at least some of the data driver 12, the timing controller 11, or the scan driver 13.

The sensor driver 220 is electrically connected to the sensor part 120 to drive the sensor part 120 and may include a sensor transmitter and a sensor receiver.

Figure 2:
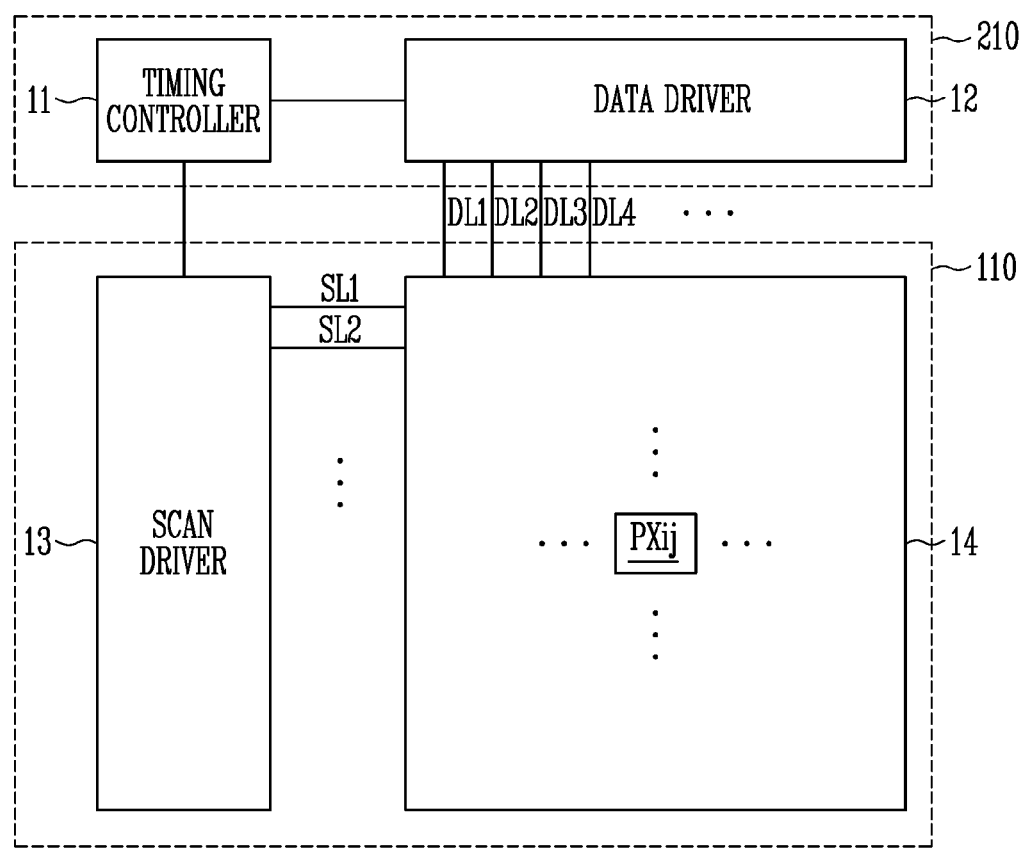
FIG. 2 illustrates an embodiment of a display part and a display driver.

FIG. 2 illustrates a schematic view for explaining a display part and a display driver according to an embodiment.

Referring to FIG. 2, the display driver 210 may include the data driver 12 and the timing controller 11, and the display part 110 may include the scan driver 13. However, as described above, whether respective functional parts are to be integrated into one IC or into a plurality of ICs, or to be mounted on the display substrate 111 may be variously configured according to specifications of the display device 1.

The timing controller 11 may receive grayscale and control signals for each frame from a processor. The processor may be or include, for example, a graphics processing unit (GPU), a central processing unit (CPU), an application processor (AP), and/or another type of processor. The control signals may include a vertical synchronization signal, a horizontal synchronization signal, a data enable signal, and/or other control signals.

Each cycle of the vertical synchronization signal may correspond to each display frame period. For example, when the vertical synchronization signal is at a first (e.g., logic high) level, this may indicate an active period of a corresponding display frame period. When the vertical synchronization signal is at a second (e.g., logic low) level, this may indicate a blank period of a corresponding display frame period. Respective cycles of the horizontal synchronization signal may correspond to respective horizontal periods. The data enable signal may be at an enable level (for example, logic high level) while grayscale values are supplied from the processor, and may be at a disable level (for example, logic low level) while grayscale values are not supplied.

The timing controller 11 may render grayscale values to correspond to the specifications of the display device 1. For example, the processor may provide a red, green, and a blue grayscale values for each unit dot. For example, when a pixel part 14 has an RGB stripe structure, each pixel may be in one-to-one correspondence with corresponding grayscale value(s). In this case, rendering of grayscale values may not be necessary. However, for example, when the pixel part 14 has a pentile structure, each pixel may not be in one-to-one correspondence with corresponding grayscale value(s) because adjacent unit dots share a pixel. In this case, rendering of grayscale values may be performed. Rendered or non-rendered grayscale values may be provided to the data driver 12. In addition, the timing controller 11 may provide a data control signal to the data driver 12. Further, the timing controller 11 may provide a scan control signal to the scan driver 13.

The data driver 12 may generate data voltages to be provided to data lines DL1, DL2, DL3, and DL4 based on the grayscale values and the data control signals received from the timing controller 11.

The scan driver 13 may use a clock signal, a scan start signal, and the like received from the timing controller 11 to generate scan signals to be provided to scan lines SL1 and SL2. The scan driver 13 may sequentially supply scan signals having a turn-on level pulse to the scan lines SL1 and SL2. For example, the scan driver 13 may supply the scan signals of a turn-on level to the scan lines at a cycle corresponding to a cycle of the horizontal synchronization signal. The scan driver 13 may include scan stages configured in a form of a shift register. The scan driver 13 may generate the scan signals through a method of sequentially transmitting a scan start signal (e.g., which is a pulse type of a turn-on level) to a next scan stage based on control of the clock signal.

The pixel part 14 includes pixels, respective ones of which may be connected to corresponding data lines and scan lines. For example, a pixel PXij may be connected to an i-th scan line and a j-th data line. The pixels may include pixels that emit first color light, pixels that emit second color light, and pixels that emit third color light. The first color, the second color, and the third color may be different colors, e.g., red, green, and blue. In one embodiment, the different colors may be magenta, cyan, and yellow. For better understanding and ease of description, an example is described where the first color, second color, and third color are red, green, and blue.

Figure 3:
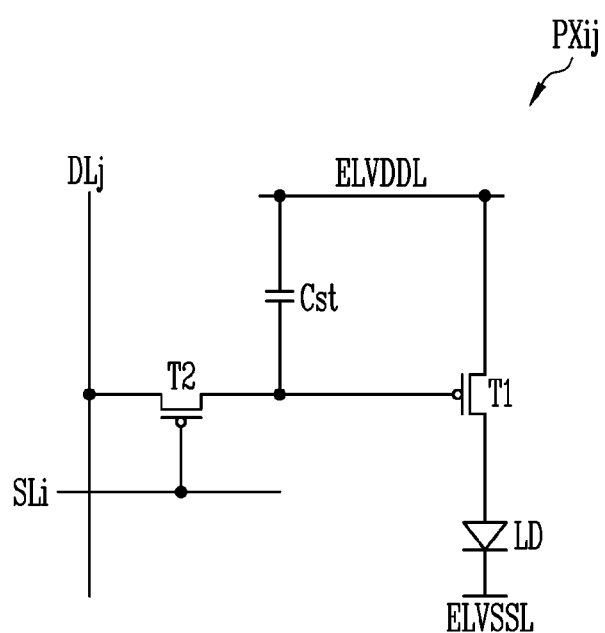
FIG. 3 illustrates an embodiment of a pixel.

FIG. 3 illustrates a schematic view for explaining a pixel PXij according to an embodiment. The pixel PXij may be representative of the pixels of the display device.

Referring to FIG. 3, the pixel PXij may include a transistor T1 having a gate electrode connected to a second electrode of a storage capacitor Cst, a first electrode connected to a first power line ELVDDL, and a second electrode connected to an anode of a light emitting diode LD. The transistor T1 may be referred to as a driving transistor.

A transistor T2 may have a gate electrode connected to an i-th scan line SLi, a first electrode connected to a j-th data line DLj, and a second electrode connected to the second electrode of the storage capacitor Cst. The transistor T2 may be referred to as a scan transistor.

The storage capacitor Cst may have a first electrode connected to the first power line ELVDDL, and the second electrode thereof may be connected to the gate electrode of the transistor T1.

The light emitting diode LD may have an anode connected to the second electrode of the transistor T1 and a cathode connected to a second power line ELVSSL. During a light emitting period of the light emitting diode LD, a first power voltage applied to the first power line ELVDDL may be different from (e.g., greater than) a second power voltage applied to the second power line ELVSSL.

The transistors T1 and T2 are illustrated as P-type transistors, but one or both of them may be N-type transistors and used with inverted polarity signals.

When a scan signal of a turn-on level is applied to the i-th scan line SLi, the transistor T2 may be turned on. In this case, a data voltage charged in the j-th data line DLj may be stored in the storage capacitor Cst. The transistor T1 may allow a driving current to flow in response to a gate-source voltage difference maintained by the storage capacitor Cst. The driving current may flow through a path of the first power line ELVDDL, the transistor T1, the light emitting diode LD, and the second power line ELVSSL. The light emitting diode LD may emit light with luminance corresponding to an amount of the driving current.

Figure 4:
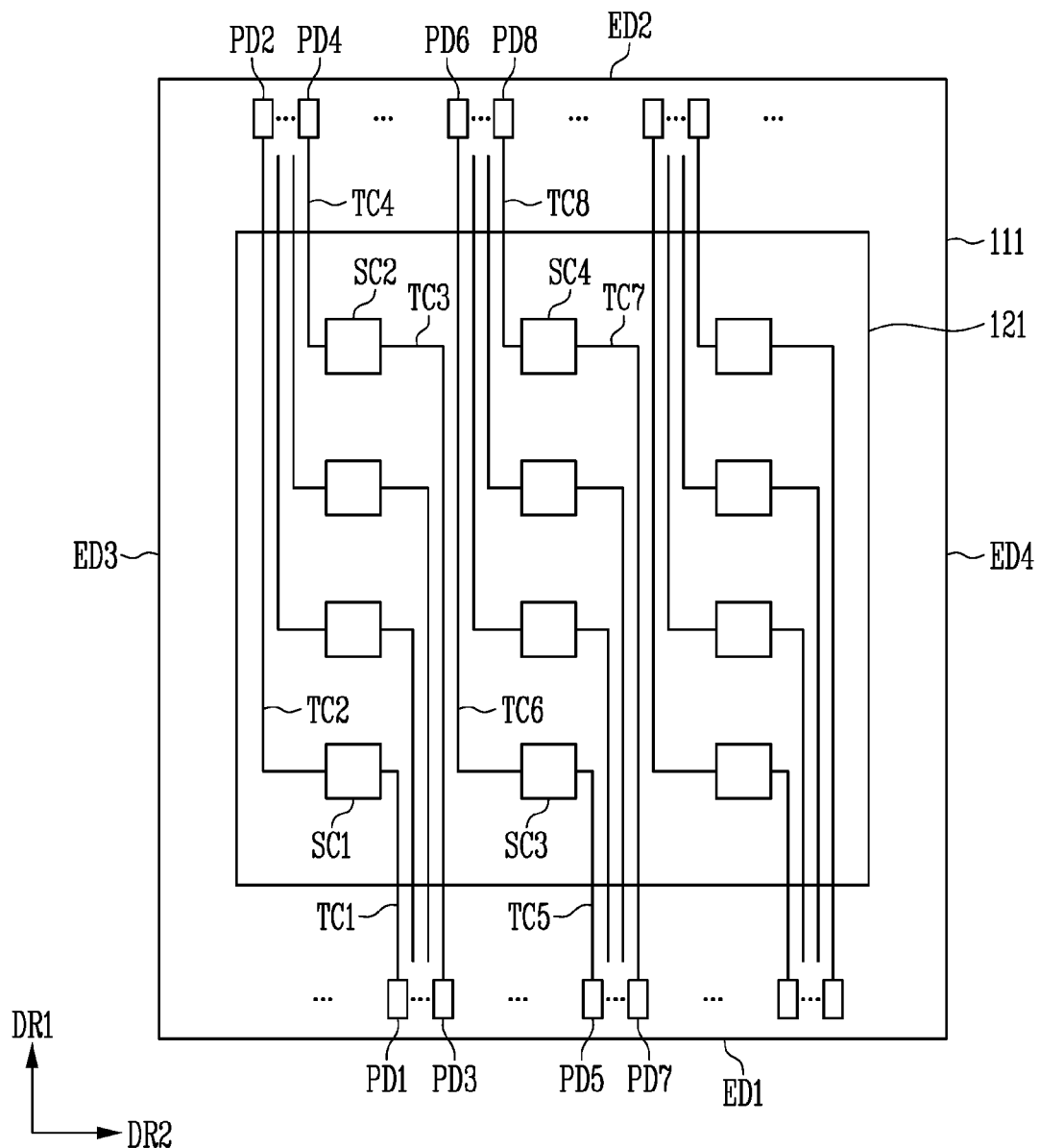
FIGS. 4 and 5 illustrate embodiments of sensors and sensor lines.
Figure 5:
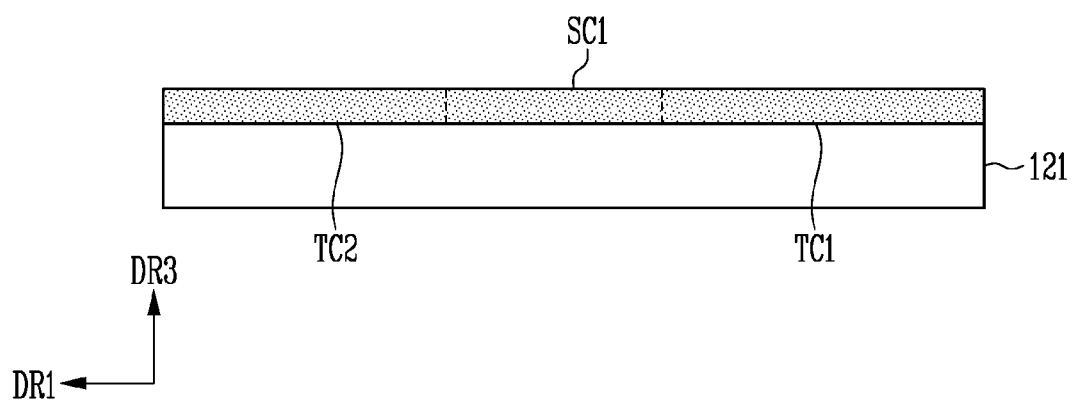

FIGS. 4 and 5 illustrate sensors and sensor lines according to embodiments.

FIG. 4 illustrates the display substrate 111, the sensor substrate 121, pads (PD1, PD2, PD3, PD4, PDS, PD6, PD7, and PD8), sensors (SC1, SC2, SC3, and SC4), and sensor lines (TC1, TC2 , TC3, TC4, TCS, TC6, TC7, and TC8). The display substrate 111 may include a display area and a non-display area outside the display area. The pixels may be disposed in the display area. For better understanding and ease of description, it is assumed that the display substrate 111 has a quadrangular shape with four edges (ED1, ED2, ED3, and ED4). However, the embodiments described herein may be applied when the display substrate 111 has other shapes, e.g., circle, oval, triangle, or another shape.

The sensor substrate 121 may cover the pixels and a portion of the display substrate 111. The sensors (SC1, SC2, SC3, and SC4) may be disposed on the sensor substrate 121. The second sensor SC2 may be disposed in the first direction DR1 from the first sensor SC1. The fourth sensor SC4 may be disposed in the first direction from the third sensor SC3. The third sensor SC3 may be disposed in the first direction DR1 from the first sensor SC1. The fourth sensor SC4 may be disposed in the second direction DR2 from the second sensor SC2. The sensors SC1 to SC4 may not overlap each other. For better understanding and ease of description, only four sensors SC1 to SC4 will be described, but other sensors and sensor lines may be disposed between the four sensors SC1 to SC4 and at the outside. For example, areas of the sensors SC1 to SC4 may be substantially the same.

The pads PD1 to PD8 may be disposed in the non-display area. The first pad PD1, the third pad PD3, the fifth pad PDS, and the seventh pad PD7 may be disposed near the first edge ED1. The first pad PD1, the third pad PD3, the fifth pad PDS, and the seventh pad PD7 may be sequentially arranged in the second direction DR2. The first pad PD1, the third pad PD3, the fifth pad PDS, the seventh pad PD7, and pads disposed in the second direction DR2 from these pads may be connected to the sensor transmitter.

The second pad PD2, the fourth pad PD4, the sixth pad PD6, and the eighth pad PD8 may be disposed near the second edge ED2. The second edge ED2 may be disposed in the first direction DR1 from the first edge ED1. The second edge ED2 and the first edge ED1 are not connected to each other, and the second edge ED2 and the first edge ED1 may be spaced apart from each other with the sensor substrate 121 therebetween. The second pad PD2, the fourth pad PD4, the sixth pad PD6, and the eighth pad PD8 may be sequentially arranged in the second direction DR2. The second pad PD2, the fourth pad PD4, the sixth pad PD6, the eighth pad PD8, and pads disposed in the second direction DR2 from these pads may be connected to the sensor receiver.

The first sensor line TC1 may connect the first pad PD1 and the first sensor SC1. The second sensor line TC2 may connect the second pad PD2 and the first sensor SC1. The third sensor line TC3 may connect the third pad PD3 and the second sensor SC2. The fourth sensor line TC4 may connect the fourth pad PD4 and the second sensor SC2. The fifth sensor line TC5 may connect the fifth pad PDS and the third sensor SC3.

The sixth sensor line TC6 may connect the sixth pad PD6 and the third sensor SC3. The seventh sensor line TC7 may connect the seventh pad PD7 and the fourth sensor SC4. The eighth sensor line TC8 may connect the eighth pad PD8 and the fourth sensor SC4. The sensor lines TC1 to TC8 may mainly be extended in the first direction DR1. The sensor lines TC1 to TC8 may not overlap each other. In addition, the sensor lines TC1 to TC8 and the sensors SC1 to SC4 may not overlap each other.

The third sensor line TC3 may be longer than the first sensor line TC1, and the fourth sensor line TC4 may be shorter than the second sensor line TC2. Accordingly, the RC loads of the first sensor SC1, the first sensor line TC1, and the second sensor line TC2 may be matched with the RC loads of the second sensor SC2, the third sensor line TC3, and the fourth sensor line TC4. For example, the sum of lengths of the first sensor line TC1 and the second sensor line TC2 may be substantially equal to a sum of lengths of the third sensor line TC3 and the fourth sensor line TC4. For example, shapes and sizes of the first sensor SC1 and the second sensor SC2 may be substantially the same. The RC load may include a resistance component according to the length/width of the sensor lines and a parasitic capacitance component with a cathode electrode and the like. Hereinafter, a redundant description thereof will be omitted.

Similarly, the seventh sensor line TC7 may be longer than the fifth sensor line TCS, and the eighth sensor line TC8 may be shorter than the sixth sensor line TC6.

Accordingly, the RC loads of the third sensor SC3, the fifth sensor line TCS, and the sixth sensor line TC6 may be matched with the RC loads of the fourth sensor SC4, the seventh sensor line TC7, and the eighth sensor line TC8.

The shapes of the first sensor SC1, the first sensor line TC1, and the second sensor line TC2 may correspond to the shapes of the third sensor SC3, the fifth sensor line TCS, and the sixth sensor line TC6. The shapes of the second sensor SC2, the third sensor line TC3, and the fourth sensor line TC4 may correspond to the shapes of the fourth sensor SC4, the seventh sensor line TC7, and the eighth sensor line TC8. Accordingly, the RC loads of sensors SC1 to SC4 may be substantially the same.

FIG. 5 illustrates an example of a cross-section near the first sensor SC1. In FIG. 5, third direction DR3 may be orthogonal to first direction DR1 and second direction DR2. For example, when the first direction DR1 and the second direction DR2 correspond to a planar direction, the third direction DR3 may correspond to a height direction.

Referring to FIG. 5, the first sensor SC1, the first sensor line TC1, and the second sensor line TC2 may be disposed on the same layer on the sensor substrate 121. For example, the first sensor SC1, the first sensor line TC1, and the second sensor line TC2 may be simultaneously formed (patterned) with the same material.

Similarly, the second sensor SC2, the third sensor line TC3, and the fourth sensor line TC4 may be disposed on the same layer on the sensor substrate 121 The third sensor SC3, the fifth sensor line TCS, and the sixth sensor line TC6 may be disposed on the same layer on the sensor substrate 121. The fourth sensor SC4, the seventh sensor line TC7, and the eighth sensor line TC8 may be disposed on the same layer on the sensor substrate 121. For example, the first to fourth sensors SC1 to SC4 may be disposed on the same layer. For example, the sensors SC1 to SC4 and the sensor lines TC1 to TC8 may be disposed on the same layer on the sensor substrate 121.

According to the present embodiment, since it is possible to configure the sensors SC1 to SC4 and the sensor lines TC1 to TC8 with one metal layer, a process cost and a configuration cost may be reduced.

Figure 6:
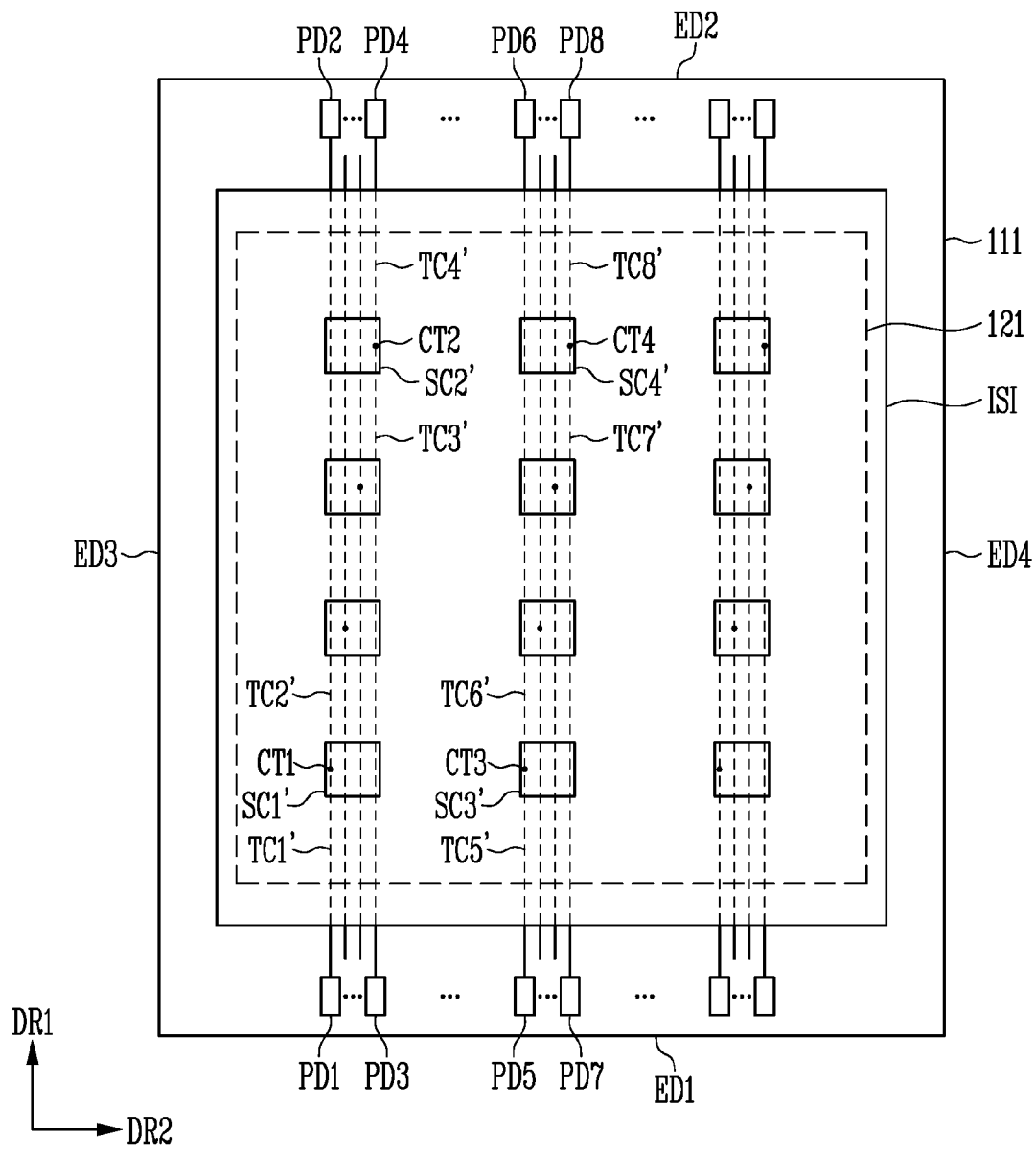
FIGS. 6 and 7 illustrate embodiments of sensors and sensor lines.
Figure 7:
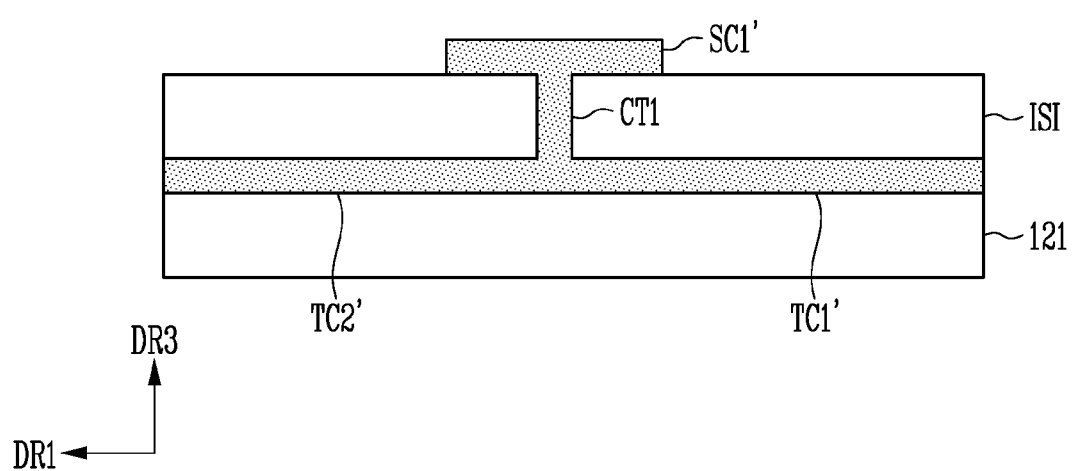
Figure 8:
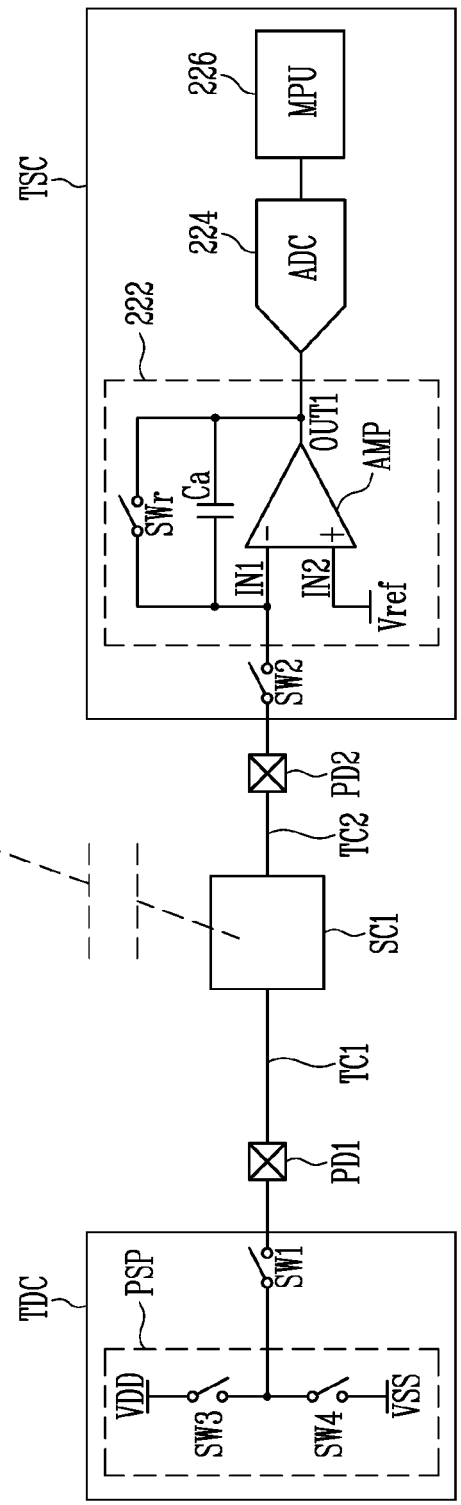
FIGS. 8-11 illustrate embodiments of a sensor transmitter and sensor receiver.

FIGS. 6 and 7 illustrate sensors and sensor lines according to an embodiment. Referring to FIG. 6, the display device 1 may further include an insulation layer ISI covering at least a portion of the sensor substrate 121. Referring to FIG. 7, the insulation layer ISI may be disposed in the third direction DR3 from the sensor substrate 121. A portion of a first sensor line TC1' and a portion of a second sensor line TC2' may be disposed between the sensor substrate 121 and the insulation layer ISI. For example, a first sensor SC1' may be disposed on the insulation layer ISI, and may be connected to the first sensor line TC1' and the second sensor line TC2' through a first contact hole CT1 of the insulation layer ISI.

Similarly, a portion of a third sensor line TC3' and a portion of a fourth sensor line TC4' may be disposed between the sensor substrate 121 and the insulation layer ISI. A second sensor SC2' may be disposed on the insulation layer ISI, and may be connected to the third sensor line TC3' and the fourth sensor line TC4' through a second contact hole CT2 of the insulation layer ISI.

A portion of a fifth sensor line TC5' and a portion of a sixth sensor line TC6' may be disposed between the sensor substrate 121 and the insulation layer ISI. A third sensor SC3' may be disposed on the insulation layer ISI, and may be connected to the fifth sensor line TC5' and the sixth sensor line TC6' through a third contact hole CT3 of the insulation layer ISI.

A portion of a seventh sensor line TC7' and a portion of a eighth sensor line TC8' may be disposed between the sensor substrate 121 and the insulation layer ISI. A fourth sensor SC4' may be disposed on the insulation layer ISI, and may be connected to the seventh sensor line TC7' and the eighth sensor line TC8' through a fourth contact hole CT4 of the insulation layer ISI.

The sensor lines TC1' to TC8' may mainly be extended in the first direction DR1. In the embodiments of FIGS. 6 and 7, descriptions overlapping those of FIG. 4 and FIG. 5 will be omitted. According to the embodiments of FIGS. 6 and 7, since sensor lines TC1' to TC8' extend on a different layer from sensors SC1' to SC4', a space in which the sensors SC1' to SC4' are disposed may be secured. Therefore, sensor resolution may be increased by increasing the number of the sensors SC1' to SC4'.

FIGS. 8 to 11 illustrate a sensor transmitter TDC and a sensor receiver TSC according to embodiments. The sensor transmitter TDC may be configured to supply a sensing signal to the first pad PD1. The sensor transmitter TDC may be configured to supply the sensing signal to the first pad PD1 during a first period. Similarly, the sensor transmitter TDC may be configured to supply the sensing signal to the third pad PD3, the fifth pad PD5, and the seventh pad PD7.

The sensor receiver TSC may be configured to receive a sampling signal from the second pad PD2. The sensor receiver TSC may be configured to receive the sampling signal from the second pad PD2 during the second period after the first period. The first period and the second period may not overlap each other. Similarly, the sensor receiver TSC may be configured to receive the sampling signal from the fourth pad PD4, the sixth pad PD6, and the eighth pad PD8.

For better understanding and ease of description, operations and configurations of the sensor transmitter TDC and the sensor receiver TSC for the first sensor SC1 will be described. The following embodiments may be applied to the sensor transmitter TDC and the sensor receiver TSC for other sensors.

The sensor transmitter TDC may include a power supplier PSP and a first switch SW1. The first switch SW1 may connect the power supplier PSP and the first pad PD1. The power supplier PSP may supply a sensing signal VDD or an initialization signal VSS. A voltage level of the sensing signal VDD may be greater than that of the initialization signal VSS. For example, the power supplier PSP may supply the sensing signal VDD to an output terminal when a third switch SW3 is turned on, and may supply the initialization signal VSS to the output terminal when a fourth switch SW4 is turned on.

The sensor receiver TSC may include an integrator 222 and a second switch SW2. The integrator 222 may output a voltage signal of a voltage level corresponding to an amount of charge charged in the first sensor SC1 to an output terminal OUT1. For example, the integrator 222 may function as a kind of sensor channel The second switch SW2 may connect the integrator 222 and the second pad PD2.

The integrator 222 may include, for example, an amplifier AMP, a capacitor Ca, and a reset switch SWr. The amplifier AMP may include a first input terminal IN1 connected to the second switch SW2, a second input terminal IN2 receiving a reference voltage Vref, and the output terminal OUT1. For example, the amplifier AMP may be an operational amplifier, the first input terminal IN1 may be an inverting terminal, and the second input terminal IN2 may be a non-inverting terminal. In one embodiment, a voltage level of the reference voltage Vref may be greater than that of the initialization signal VSS and less than that of the sensing signal VDD. The capacitor Ca may connect the first input terminal IN1 and the output terminal OUT1. The reset switch SWr may connect the first input terminal IN1 and the output terminal OUT1.

In addition, the sensor receiver TSC may further include an analog digital converter 224 and a processor 226. The analog digital converter 224 may receive an output signal of the integrator 222. The analog digital converter 224 may convert an analog voltage level output by the integrator 222 to a digital value for output. The processor 226 may receive an output signal of the analog digital converter 224. The processor 226 may determine a user touch input based on the received digital value.

Figure 9:
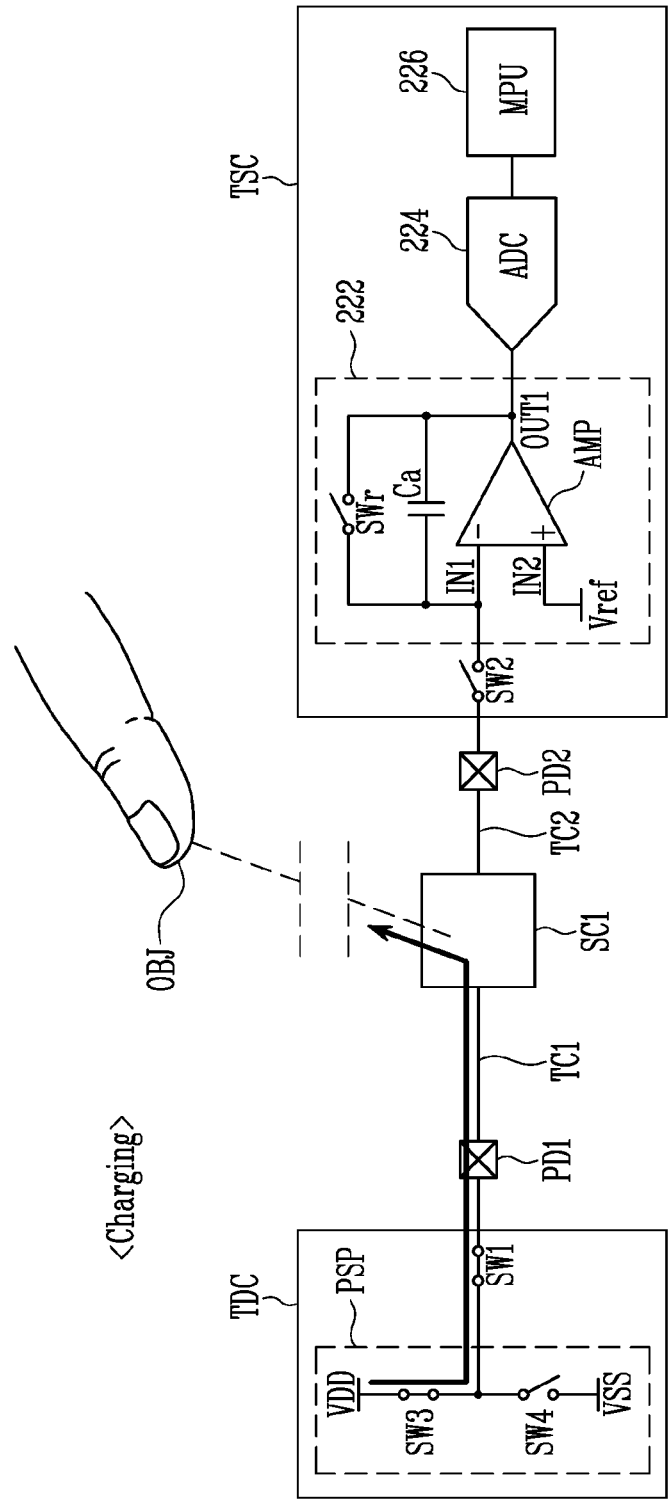
Figure 10:
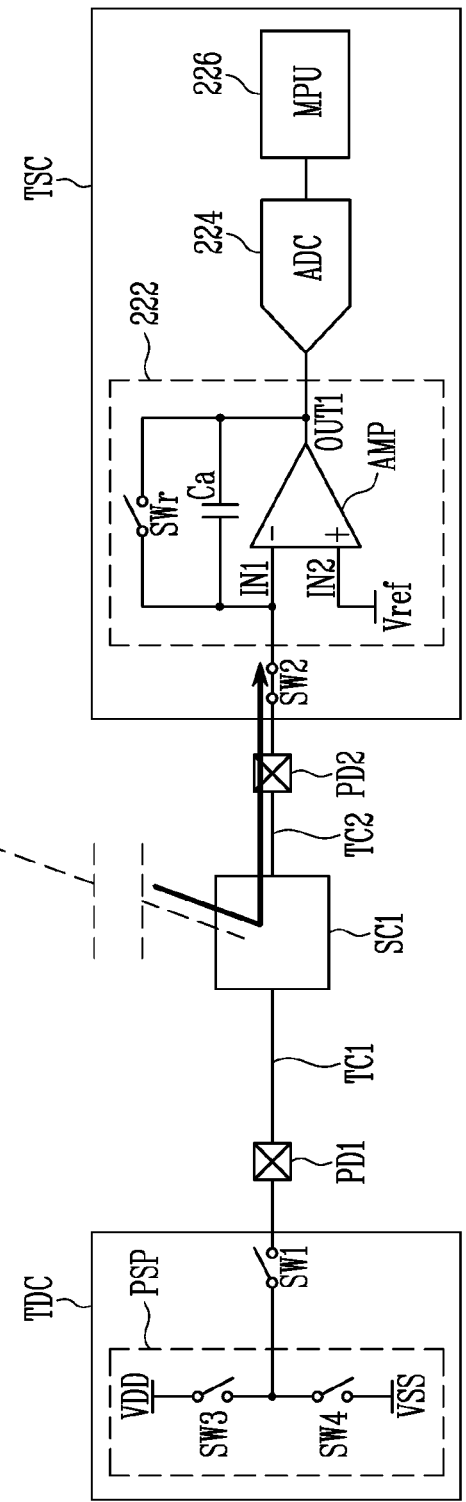
Figure 11:
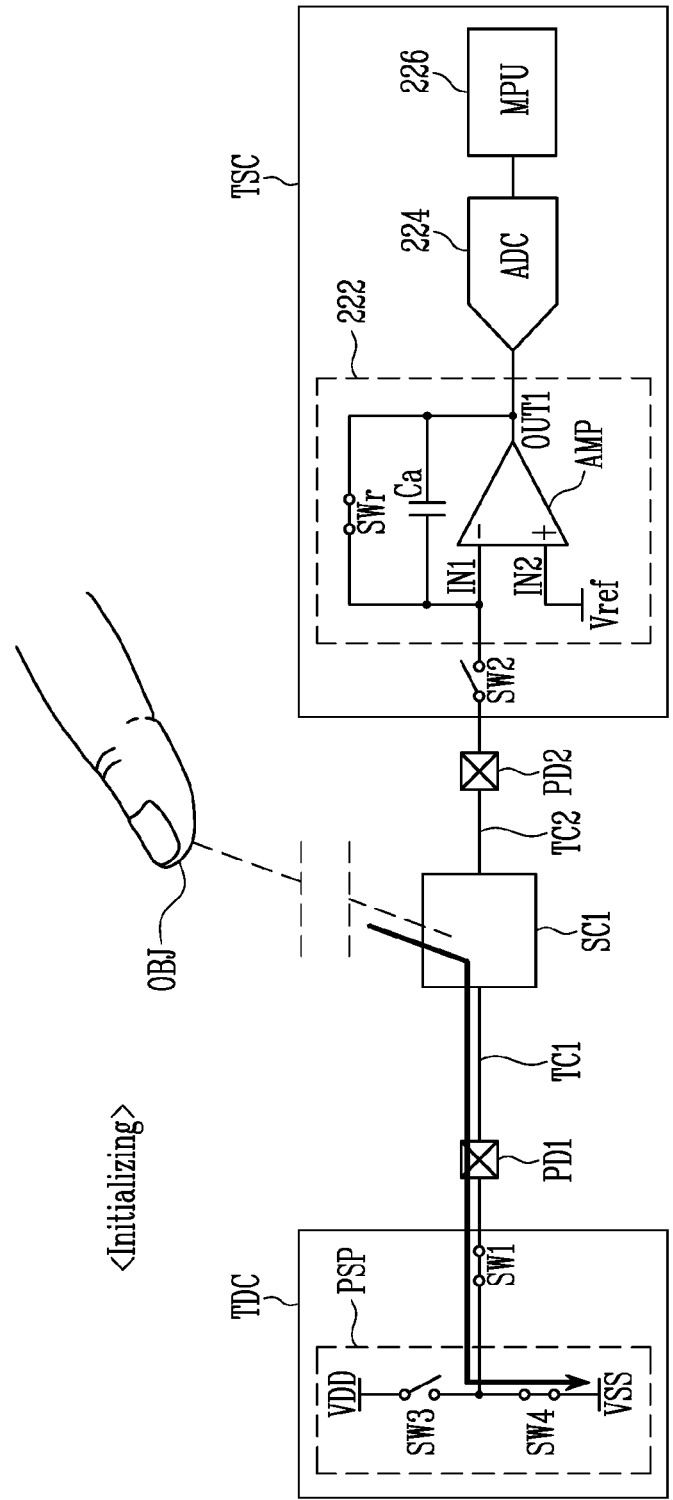

An example of the first period for charging the first sensor SC1 is described with reference to FIG. 9.

The power supplier PSP may supply the sensing signal VDD to the first pad PD1 during the first period. For example, when the third switch SW3 is turned on during the first period, the power supplier PSP may supply the sensing signal VDD to the first pad PD1.

The first switch SW1 may electrically connect the power supplier PSP and the first pad PD1 during the first period. For example, the first switch SW1 may be turned on during the first period. Accordingly, the sensing signal VDD may be applied to the first sensor SC1 during the first period. In this case, the self-capacitance of the first sensor SC1 may vary depending on whether an object OBJ (e.g., finger or other object) closely approaches the first sensor SC1. Thus, the amount of charge charged in the first sensor SC1 may vary.

In this case, the second switch SW2 may electrically separate the integrator 222 from the second pad PD2 during the first period. For example, the second switch SW2 may be turned during the first period. An example of the second period for sampling the first sensor SC1 is described with reference to FIG. 10.

The second switch SW2 may electrically connect the integrator 222 and the second pad PD2 during the second period after the first period. For example, the second switch SW2 may be in a turn-on state during the second period.

The integrator 222 may receive a sampling signal from the second pad PD2 during the second period. For example, the integrator 222 may output a voltage signal corresponding to an amount of charge charged in the first sensor SC1 to the output terminal OUT1. At a finishing point of time of the second period, the voltage level of the first sensor SC1 may be substantially the same as the voltage level of the reference voltage Vref.

In this case, the first switch SW1 may electrically separate the power supplier PSP from the first pad PD1 during the second period. For example, the first switch SW1 may be in a turn-off state during the second period.

The analog digital converter 224 may convert the voltage signal received from the integrator 222 to a digital value, and the processor 226 may determine a touch input based on the received digital value. An example of a third period for initializing the first sensor SC1 is described with reference to FIG. 11.

The first switch SW1 may electrically connect the power supplier PSP and the first pad PD1 during the third period after the second period. For example, the first switch SW1 may be in a turn-on state during the third period.

The power supplier PSP may supply the initialization signal VSS to the first pad PD1 during the third period. For example, since the fourth switch SW4 is turned on during the third period, the power supplier PSP may supply the initialization signal VSS to the first pad PD1. Accordingly, at a finishing point of time of the third period, the voltage level of the first sensor SC1 may be the same as the voltage level of the initialization signal VSS. For example, the voltage level of the initialization signal VSS may be different from (e.g., lower than) the voltage level of the reference voltage Vref.

The reset switch SWr is turned on during the third period, and thus it is possible to initialize an amount of charge of the capacitor Ca. In one embodiment, the reset switch SWr may be turned on during a period other than the third period.

Figure 12:
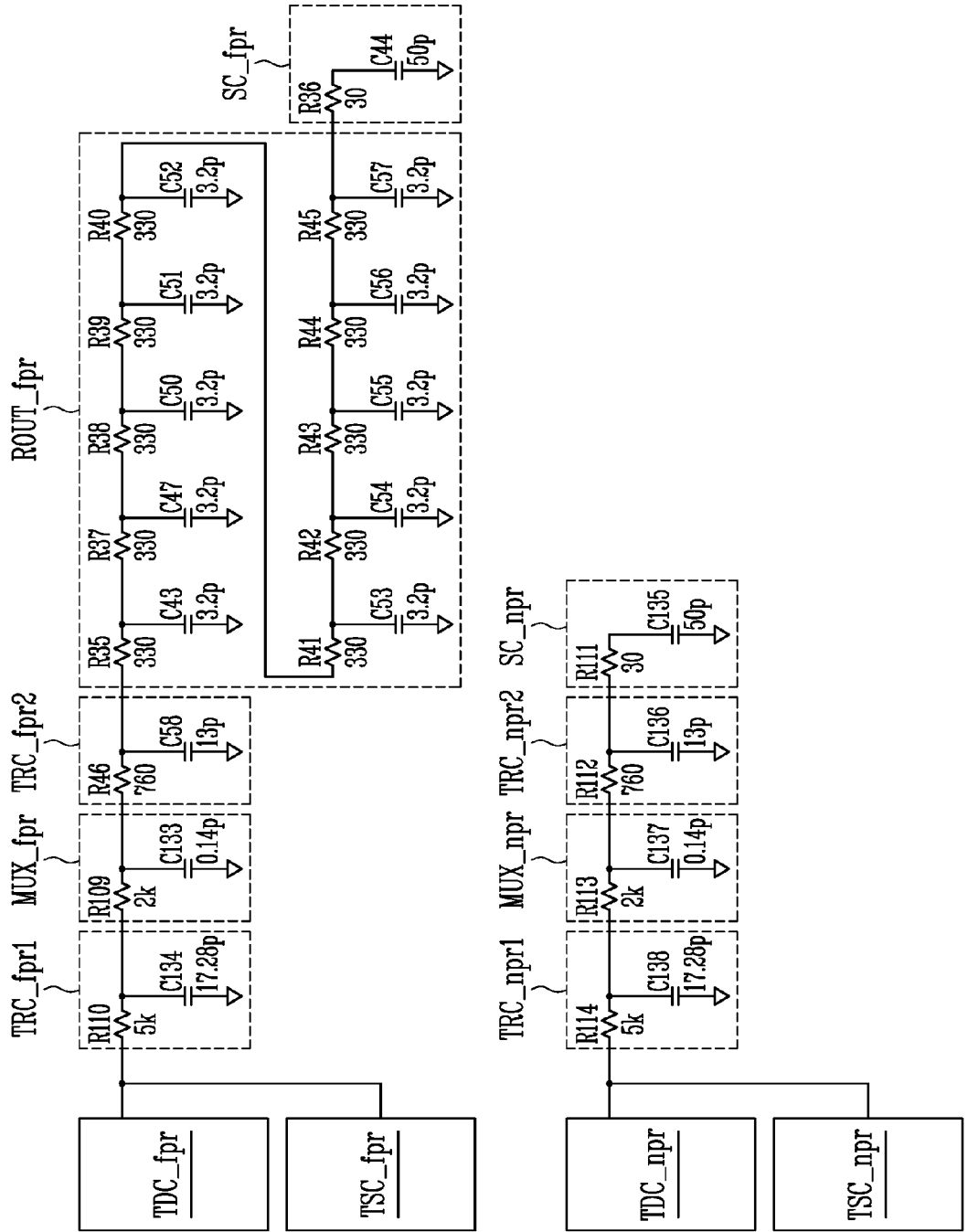
FIG. 12 illustrates an arrangement of a sensor transmitter and a sensor receiver according to a comparative example.
Figure 13:
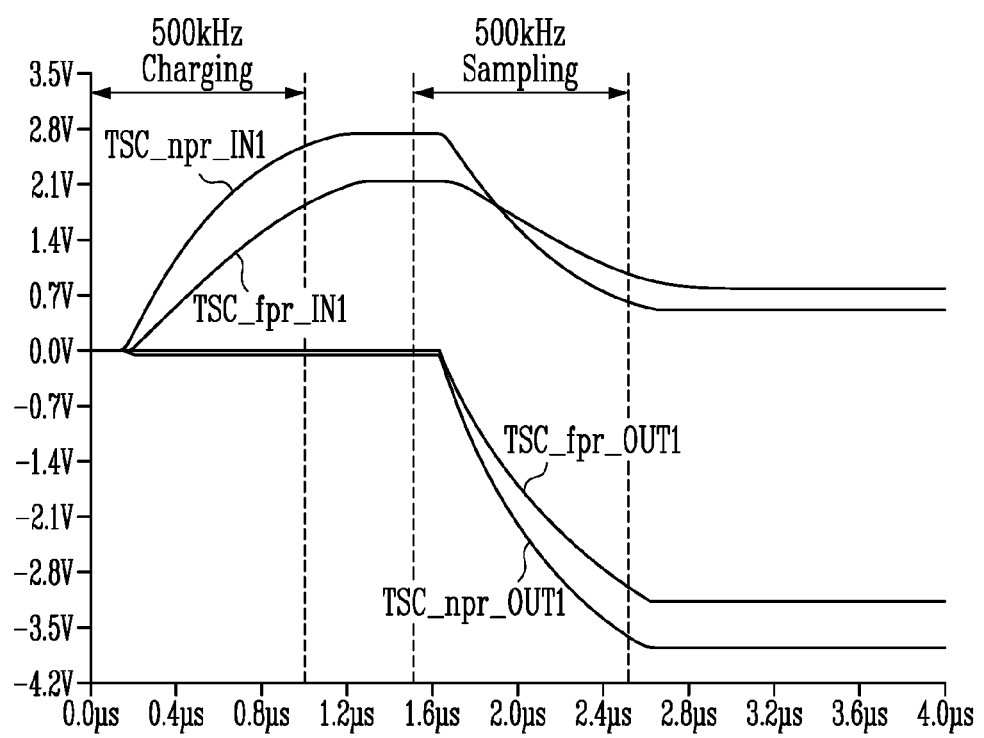
FIG. 13 illustrates simulation results according to the comparative example.

FIG. 12 illustrates an arrangement of a sensor transmitter and receiver, and FIG. 13 illustrates corresponding simulation results according to a comparative example.

Referring to FIG. 12, according to the comparative example, a sensor SC_fpr that is relatively far away from a sensor transmitter TDC_fpr and a sensor SC_npr that is relatively close to a sensor transmitter TDC_npr are simulated. For example, the sensor SC_fpr includes a resistance component R36 of 30 ohm and a capacitance C44 of 50 pF (picofarads). The sensor SC_npr includes a resistance component R111 of 30 ohm and a capacitance C135 of 50 pF.

A wire load TRC_fpr1, a multiplexer load MUX_fpr, a wire load TRC_fpr2, and a routing load ROUT_fpr exist in an electrical path between a common node of the sensor transmitter TDC_fpr and sensor receiver TDC_fpr and the sensor SC_fpr. The routing load ROUT_fpr may be an RC load by wires and elements on sensing area SA.

The wire load TRC_fpr1 may include a resistance component R110 of 5 kohm and a capacitance C134 of 17.28 pF. The multiplexer load MUX_fpr may include a resistance component R109 of 2 kohm and a capacitance C133 of 0.14 pF. The wire load TRC_fpr2 may include a resistance component R46 of 760 ohm and a capacitance C58 of 13 pF. The routing load ROUT_fpr may include resistance components (R35, R37, R38, R39, R40, R41, R42, R43, R44, and R45) of 330 ohm connected in series in the path, and capacitances (C43, C47, C50, C51, C52, C53, C54, C55, C56, and C57) of 3.2 pF respectively branching from nodes to which the resistance components are connected.

A wire load TRC_npr1, a multiplexer load MUX_npr, and a wire load TRC_npr2 exist in an electrical path between a common node of the sensor transmitter TDC_npr and sensor receiver TDC_npr and the sensor SC_npr. The wire load TRC_npr1 may include a resistance component R114 of 5 kohm and a capacitance C138 of 17.28 pF. The multiplexer load MUX_npr may include a resistance component R113 of 2 kohm and a capacitance C137 of 0.14 pF. The wire load TRC_npr2 may include a resistance component R112 of 760 ohm and a capacitance C136 of 13 pF.

FIG. 13 illustrates a graph TSC_fpr_IN1 of the voltage of the first input terminal IN1 of the sensor receiver TSC_fpr and a graph TSC_fpr_OUT1 of the voltage of the output terminal OUT1 of the sensor receiver TSC_fpr, in a case in which the sensor transmitter TDC_fpr supplies a sensing signal of 500 kHz and the sensor receiver TSC_fpr receives a sampling signal of 500 kHz. In addition, in a case in which the sensor transmitter TDC_npr supplies a sensing signal of 500 kHz and the sensor receiver TSC_npr receives a sampling signal of 500 kHz, a graph TSC_npr_IN1 of the voltage of the first input terminal IN1 of the sensor receiver TSC_npr and a graph TSC_npr_OUT1 of the voltage of the output terminal OUT1 of the sensor receiver TSC_npr are illustrated.

Referring to FIG. 13, it can be confirmed that depending on distances (or positions) between the sensor transmitters TDC_fpr and TDC_npr and the sensors SC_fpr and SC_npr, an undesirable deviation occurs in the input and output voltages of the sensor receivers TSC_fpr and TSC_npr.

Figure 14:
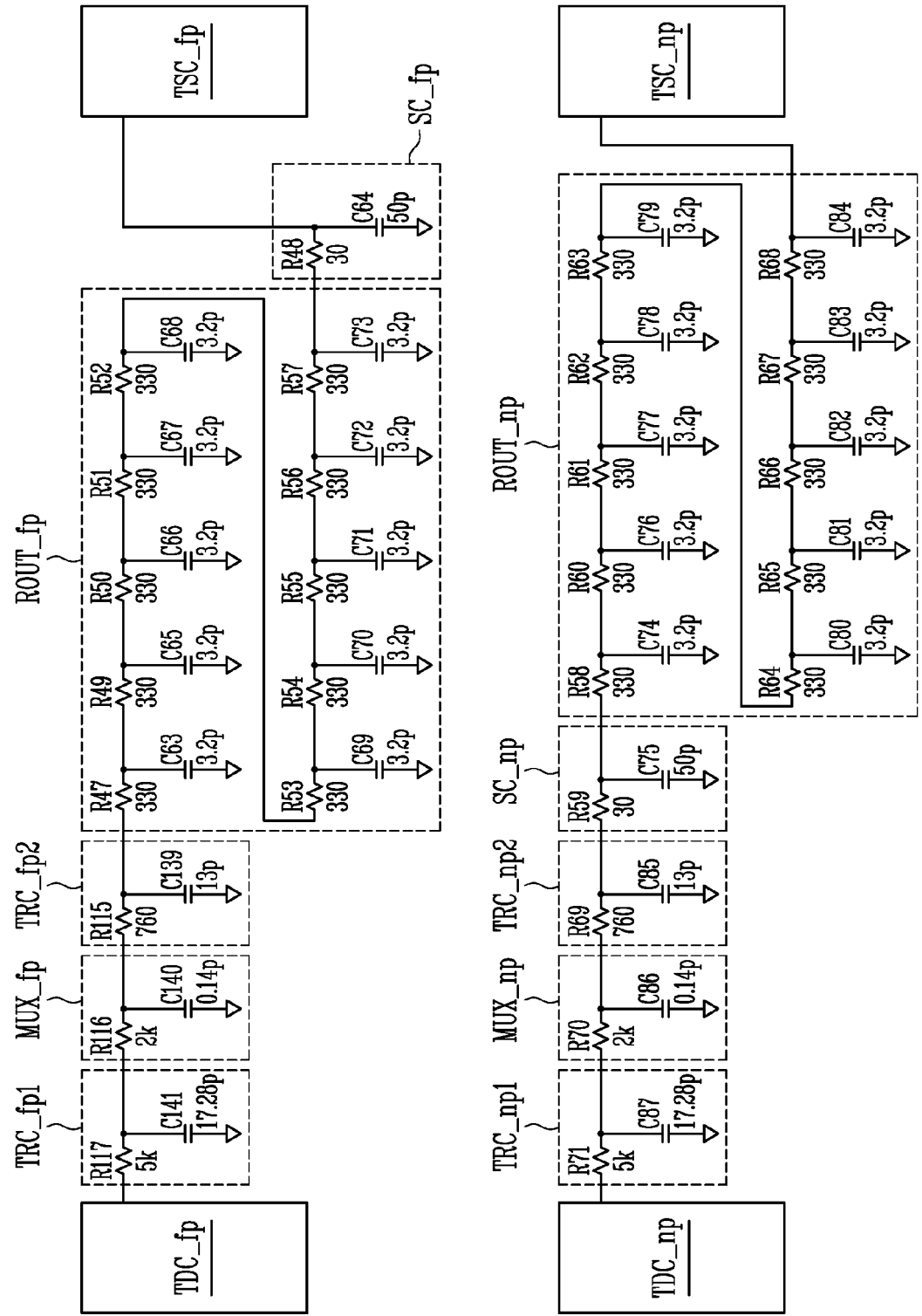
FIG. 14 illustrates an arrangement of a sensor transmitter and sensor receiver according to an embodiment.
Figure 15:
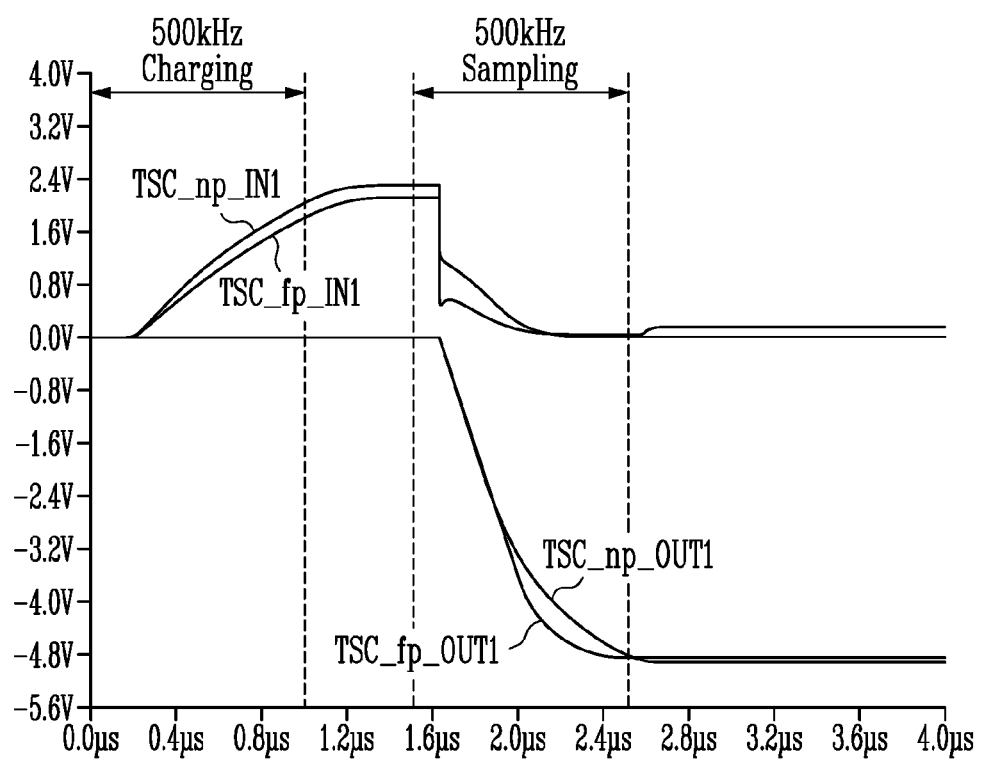
FIG. 15 illustrates an example of simulation results corresponding to the embodiment of FIG. 14.

FIG. 14 illustrates an arrangement of a sensor transmitter and sensor receiver according to an embodiment, and FIG. 15 illustrate an examples of corresponding simulation results.

Referring to FIG. 14, a sensor SC_fp that is relatively far away from a sensor transmitter TDC_fp and a sensor SC_np that is relatively close to a sensor transmitter TDC_np are exemplarily simulated. For example, the sensor SC_fp includes a resistance component R48 of 30 ohm and a capacitance C64 of 50 pF. For example, the sensor SC_np includes a resistance component R59 of 30 ohm and a capacitance C75 of 50 pF.

In one implementation, a wire load TRC_fp1, a multiplexer load MUX_fp, a wire load TRC_fp2, and a routing load ROUT_fp exist in an electrical path between the sensor transmitter TDC_fp and the sensor SC_fp. The routing load ROUT_fp may be an RC load by wires and elements on the sensing area SA. For example, the wire load TRC_fp1 may include a resistance component R117 of 5 kohm and a capacitance C141 of 17.28 pF. The multiplexer load MUX_fp may include a resistance component R116 of 2 kohm and a capacitance C140 of 0.14 pF. The wire load TRC_fp2 may include a resistance component R115 of 760 ohm and a capacitance C139 of 13 pF. The routing load ROUT_fp may include resistance components (R47, R49, R50, R51, R52, R53, R54, R55, R56, and R57) of 330 ohm connected in series in the path, and capacitances (C63, C65, C66, C67, C68, C69, C70, C71, C72, and C73) of 3.2 pF respectively branching from nodes to which the resistance components are connected.

In one implementation, a wire load TRC_np1, a multiplexer load MUX_np, and a wire load TRC_np2 exist in an electrical path between the sensor transmitter TDC_np and the sensor SC_np. In addition, a routing load ROUT_np exists in an electrical path between the sensor SC_np and the sensor receiver TSC_np. The routing load ROUT_np may be an RC load by wires and elements on the sensing area SA.

The wire load TRC_np1 may include a resistance component R71 of 5 kohm and a capacitance C87 of 17.28 pF. The multiplexer load MUX_np may include a resistance component R70 of 2 kohm and a capacitance C86 of 0.14 pF. The wire load TRC_np2 may include a resistance component R69 of 760 ohm and a capacitance C85 of 13 pF. The routing load ROUT_np may include resistance components (R58, R60, R61, R62, R63, R64, R65, R66, R67, and R68) of 330 ohm connected in series in the path, and capacitances (C74, C76, C77, C78, C79, C80, C81, C82, C83, and C84) of 3.2 pF respectively branching from nodes to which the resistance components are connected.

FIG. 15 illustrates a graph TSC_fp_IN1 of the voltage of the first input terminal IN1 of the sensor receiver TSC_fp and a graph TSC_fp_OUT1 of the voltage of the output terminal OUT1 of the sensor receiver TSC_fp, in a case in which the sensor transmitter TDC_fp supplies a sensing signal of 500 kHz and the sensor receiver TSC_fp receives a sampling signal of 500 kHz. In addition, in a case in which the sensor transmitter TDC_np supplies a sensing signal of 500 kHz and the sensor receiver TSC_np receives a sampling signal of 500 kHz, a graph TSC_np_IN1 of the voltage of the first input terminal IN1 of the sensor receiver TSC_np and a graph TSC_np_OUT1 of the voltage of the output terminal OUT1 of the sensor receiver TSC_np are illustrated.

Comparing FIG. 15 and FIG. 13, it can be confirmed that depending on distances (or positions) between the sensors SC_fp and SC_np and the sensor transmitters TDC_fp and TDC_np, no deviation occur in the input and output voltages of the sensor receivers TSC_fp and TSC_np.

In accordance with one embodiment, a display device includes a display panel including pixels and a plurality of pads, a touch panel including a first touch sensor and a second touch sensor, a first set of lines connecting the first touch sensor to first and second pads of the plurality of pads, and a second set of lines connecting the second touch sensor to third and fourth pads of the plurality of pads. Each of the first touch sensor and the second touch sensor may be configured to sense a touch input based on self-capacitance. Lengths of the first set of lines and the first touch sensor has an RC load substantially equal an RC load that corresponds to lengths of the second set of lines and the second touch sensor. These features may correspond to those of embodiments that have been previously described herein.

While this invention has been described in connection with practical embodiments, it is to be understood that the invention is not limited to the disclosed embodiments, but is intended to cover various modifications and equivalent arrangements within the spirit and scope of the appended claims. Therefore, those skilled in the art will understand that various modifications and other equivalent embodiments are possible. Thus, the technical scope of the present invention may be determined based on the technical spirit of the appended claims. The embodiments may be combined to form additional embodiments.

What is claimed is:

1. A display device, comprising:
a display substrate including a non-display area at least partially surrounding a display area;
pixels disposed in the display area;
a sensor substrate covering the pixels and a portion of the display substrate;
a first pad disposed in the non-display area;
a second pad disposed in the non-display area;
a first sensor disposed on the sensor substrate;
a first sensor line connecting the first pad and the first sensor;
a second sensor line connecting the second pad and the first sensor;
a sensor transmitter configured to supply a sensing signal to the first pad during a first period; and
a sensor receiver configured to receive a sampling signal from the second pad during a second period after the first period, wherein the first pad is connected to a first switch of the sensor transmitter and the second pad is connected to a second switch of the sensor receiver.

2. The display device of claim 1, further comprising:
a third pad disposed in the non-display area;
a fourth pad disposed in the non-display area;
a second sensor disposed on the sensor substrate;
a third sensor line connecting the third pad and the second sensor; and
a fourth sensor line connecting the fourth pad and the second sensor,
wherein the sensor transmitter is configured to supply a sensing signal to the third pad, and wherein the sensor receiver is configured to receive a sampling signal from the fourth pad.

3. The display device of claim 2, wherein:
the third sensor line is longer than the first sensor line, and
the fourth sensor line is shorter than the second sensor line.

4. The display device of claim 3, wherein an area of the first sensor is substantially same as an area of the second sensor.

5. The display device of claim 2, wherein:
the first pad and the third pad are disposed adjacent to a first edge of the display substrate,
the second pad and the fourth pad are disposed adjacent to a second edge of the display substrate,
the second sensor is disposed in a first direction from the first sensor, and
the second edge is disposed in the first direction from the first edge.

6. The display device of claim 5, wherein:
the third pad is disposed in a second direction different from the first direction from the first pad, and
the fourth pad is disposed in the second direction from the second pad.

7. The display device of claim 2, wherein the first sensor, the first sensor line, and the second sensor line are disposed on a same layer on the sensor substrate.

8. The display device of claim 7, wherein the second sensor, the third sensor line, and the fourth sensor line are disposed on a same layer on the sensor substrate.

9. The display device of claim 8, wherein the first sensor and the second sensor are disposed on the same layer.

10. The display device of claim 2, further comprising:
an insulation layer covering at least a portion of the sensor substrate, wherein a portion of the first sensor line and a portion of the second sensor line are disposed between the sensor substrate and the insulation layer, and wherein the first sensor is disposed on the insulation layer and connected to the first sensor line and the second sensor line through a first contact hole of the insulation layer.

11. The display device of claim 10, wherein:

a portion of the third sensor line and a portion of the fourth sensor line are disposed between the sensor substrate and the insulation layer, and the second sensor is disposed on the insulation layer and connected to the third sensor line and the fourth sensor line through a second contact hole of the insulation layer.

12. The display device of claim 11, wherein the first sensor and the second sensor are disposed on a same layer.

13. The display device of claim 12, wherein:

the second sensor is disposed in a first direction from the first sensor, and the first sensor line, the second sensor line, the third sensor line, and the fourth sensor line extend in the first direction.

14. A display device, comprising:

a display substrate including a non-display area at least partially surrounding a display area;

pixels disposed in the display area;

a sensor substrate covering the pixels and a portion of the display substrate;

a first pad disposed in the non-display area;

a second pad disposed in the non-display area;

a first sensor disposed on the sensor substrate;

a first sensor line connecting the first pad and the first sensor;

a second sensor line connecting the second pad and the first sensor;

a sensor transmitter configured to supply a sensing signal to the first pad during a first period; and a sensor receiver configured to receive a sampling signal from the second pad during a. second period after the first period, wherein the sensor transmitter includes:

a power supplier; and a first switch configured to connect the power supplier and the first pad.

15. The display device of claim 14, wherein the sensor receiver includes:

an integrator; and a second switch configured to connect the integrator and the second pad.

16. The display device of claim 15, wherein:

the first switch is configured to electrically connect the power supplier and the first pad during the first period, the power supplier is configured to supply the sensing signal to the first pad during the first period, and the second switch is configured to electrically separate the integrator from the second pad during the first period.

17. The display device of claim 16, wherein:

the second switch is configured to electrically connect the integrator and the second pad during the second period, the integrator is configured to receive the sampling signal from the second pad during the second period, and the first switch is configured to electrically separate the power supplier from the first pad during the second period.

18. The display device of claim 17, wherein:

the first switch is configured to electrically connect the power supplier and the first pad during a third period after the second period, and the power supplier is configured to supply an initialization signal to the first pad during the third period.

19. The display device of claim 15, wherein the integrator includes:

an amplifier including a first input terminal connected to the second switch, a second input terminal configured to receive a reference voltage, and an output terminal;

a capacitor connecting the first input terminal and the output terminal; and a reset switch configured to connect the first input terminal and the output terminal.

20. The display device of claim 19, wherein the sensor receiver includes:

an analog-to-digital converter configured to receive an output signal of the integrator; and a processor configured to receive an output signal of the analog-to-digital converter.

* * * * *